(12) United States Patent
Wegmann

(10) Patent No.: US 7,365,861 B2
(45) Date of Patent: Apr. 29, 2008

(54) METHOD AND APPARATUS FOR DETERMINING TELECENTRICITY AND MICROLITHOGRAPHY PROJECTION EXPOSURE APPARATUS

(75) Inventor: Ulrich Wegmann, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 320 days.

(21) Appl. No.: 11/144,748

(22) Filed: Jun. 6, 2005

(65) Prior Publication Data

US 2006/0012799 A1 Jan. 19, 2006

Related U.S. Application Data

(60) Provisional application No. 60/576,809, filed on Jun. 4, 2004.

(51) Int. Cl.
*G01B 9/02* (2006.01)
(52) U.S. Cl. ...................... 356/515; 356/521
(58) Field of Classification Search ................. 356/515, 356/521, 124, 512
See application file for complete search history.

(56) References Cited

U.S. PATENT DOCUMENTS

| 4,413,909 A | * | 11/1983 | Pohle ........................ 356/521 |
| 7,158,237 B2 | * | 1/2007 | Schriever et al. ........... 356/515 |
| 2002/0001088 A1 | | 1/2002 | Wegmann et al. | |

FOREIGN PATENT DOCUMENTS

| DE | 101 09 929 A1 | 11/2001 |
| EP | 1 231 514 A1 | 8/2002 |
| EP | 1 231 517 A1 | 8/2002 |

* cited by examiner

*Primary Examiner*—Hwa (Andrew) Lee
(74) *Attorney, Agent, or Firm*—Sughrue Mion, PLLC

(57) ABSTRACT

An apparatus having a wavefront measuring device (1, 2, 7), which is designed to determine a wavefront tilt in one or more non-parallel transverse directions perpendicular to an optical axis of the optical imaging system, at a plurality of measurement points which are mutually offset in the direction of the optical axis. An evaluation unit (5) determines a telecentricity error value from the wavefront tilt measurement values obtained by the wavefront measuring device.

15 Claims, 2 Drawing Sheets

METHOD AND APPARATUS FOR DETERMINING TELECENTRICITY AND MICROLITHOGRAPHY PROJECTION EXPOSURE APPARATUS

The following disclosure is based on U.S. Provisional Application No. 60/576,809 filed on Jun. 4, 2004, which is hereby incorporated into this application by reference.

BACKGROUND OF THE INVENTION

1. Field of the Invention

The invention relates to an apparatus and a method for determining the telecentricity of an optical imaging system, and to a microlithography projection exposure apparatus which is provided with such an apparatus.

2. Field of the Related Art

As is known, the determination of telecentricity is used to identify deviations from the ideal telecentric behavior of optical imaging systems, i.e. telecentricity errors. In an imaging system which is affected by a telecentricity error, the primary ray for a respective field point travels not parallel to the optical axis of the imaging system as in the error-free case, but tilted relative thereto, the tilt angle representing a quantitative measure of the telecentricity error. This per se suggests that the telecentricity error can be determined by measuring the energy centroid position of the image of a respective field point in an xy plane perpendicular to the optical axis, at a plurality of measurement points which are mutually offset in the z direction of the optical axis, and by calculating the tilt angle trigonometrically therefrom. This, however, is faced with the difficulty that the energy centroid position of the image of a respective field point in the xy plane may also vary as a function of the z position because of other image errors which typically affect imaging systems, such as coma and Petzval correction errors. In general, therefore, the telecentricity error cannot be deduced merely from such a measurement of the energy centroid position in the xy plane as a function of the z position.

For example, it is conceivable to determine the telecentricity by a Moiré technique in which a first Moiré structure, arranged in an object plane of the imaging system, is projected onto a second Moiré structure, identical except for the imaging scale, arranged in an image plane of the imaging system. This creates a Moiré superposition pattern in the image plane, which, as is known, exhibits so-called Moiré fringes when the imaging system is affected by a distortion error. If the z position of the Moiré structure on the image side is subsequently modified, the Moiré superposition pattern will not change in the ideal case of an imaging system which is free from aberration and is telecentric on the image side. Yet if the imaging system has a telecentricity error but is otherwise free from aberration, then the Moiré superposition pattern changes and the telecentricity error can then be found in this case from its variation as a function of the z position. If the imaging system is also affected by aberrations, however, then variations in the Moiré superposition pattern due to this are superimposed on those which are caused by the telecentricity error. If illumination which does not fully and uniformly fill a pupil of the imaging system is selected for the Moiré measurement, then this entails another perturbing effect when trying to find the telecentricity error.

Further perturbing effects may result from planarity errors of a measurement reticle placed on the object side, or a measurement surface placed on the image side, since with such a so-called staggered focus measurement, i.e. a measurement at different z positions, a different region of the air image is respectively recorded for various field points and employed for calculating the telecentricity error.

SUMMARY OF THE INVENTION

It is a technical object of the invention to provide an apparatus and a method of the type mentioned in the introduction, with which a telecentricity error can be determined comparatively accurately even for an optical imaging system affected by aberration. It is also an object of the invention to provide a microlithography projection exposure apparatus which has an optical imaging system and which is provided with an apparatus for determining the telecentricity of this imaging system.

The invention achieves this object by providing an apparatus having a wavefront measuring device which is designed to determine a wavefront tilt in one or more non-parallel transverse directions perpendicular to an optical axis of the optical imaging system, at a plurality of measurement points which are mutually offset in the direction of the optical axis, and having an evaluation unit which determines a telecentricity error value from the wavefront tilt measurement values obtained by the wavefront measuring device.

Use of the wavefront measuring device makes it possible to find the wavefront tilt, which is a measure of the telecentricity error and may for example be described by the Zernike coefficients Z2 and/or Z3, in isolation from any other effects due to aberration for a respective field point, at the various measurement points along the optical axis, so that the evaluation unit can determine a telecentricity error value comparatively accurately therefrom even if the imaging system is affected by aberration.

In one refinement of the apparatus, the wavefront measuring device has a measurement reticle to be arranged on an object side of the optical imaging system, with at least two measurement structures which are respectively allocated to a field point, and a measurement unit to be arranged on an image side of the optical imaging system, which is designed to record wavefront interferences suitable for determining the wavefront tilt, separately for the two measurement structures. This makes parallel multichannel telecentricity determination possible simultaneously for a plurality of field points, and in the extreme case simultaneously for all the field points.

In another configuration of the apparatus, the interferometric wavefront measuring device comprises a measurement reticle to be arranged on an object side of the optical imaging system, with at least one measurement structure for an associated field point, and a measurement unit to be arranged on an image side of the optical imaging system, which is designed to record wavefront interferences suitable for determining the wavefront tilt for the at least one measurement structure, and which to this end comprises a diffraction grating and a downstream detector unit. By virtue of the diffraction grating, a plurality of diffraction orders capable of interference can be produced for the wavefront delivered by the object-side measurement structure of the respective field point, and the resulting interferogram can be recorded by the detector unit. To this end, the detector unit comprises a suitable detector surface behind the diffraction grating, with or without the interposition of detector imaging optics.

In another configuration of the apparatus, the interferometric wavefront measuring device comprises a positioning unit for moving the measurement unit to the various measurement points along the optical axis.

The wavefront measuring device may, for example, be of an interferometric type, e.g. designed as a lateral shear interferometer, or of a Shack-Hartmann type.

The evaluation unit in one refinement of the invention is designed to find, from the wavefront tilt measurement values which are obtained, a linear profile thereof as a function of the measurement position in the direction of the optical axis, and to determine the telecentricity error value with the aid of this linear function as found. The linear relation may, for example, be found by a conventional linear curve fitting method.

In one refinement of the apparatus, it is designed for determining the telecentricity of an optical imaging system for a microlithography projection exposure apparatus.

In another aspect, the invention comprises to a method for determining the telecentricity of an optical imaging system, having the steps of using a wavefront measuring device to determine a wavefront tilt in one or more non-parallel transverse directions perpendicular to an optical axis of the optical imaging system, at a plurality of measurement points which are mutually offset in the direction of the optical axis, and of determining a telecentricity error value from the wavefront tilt measurement values as obtained.

In a refinement of the method, in order to determine the wavefront tilt in the two transverse directions, the wavefront measuring device produces wavefront interferences and at least one of the Zernike coefficients Z2 and Z3 is found therefrom, and the telecentricity error value is determined from a linear dependency on the measurement position in the direction of the optical axis, which is ascertained for the Zernike coefficient or coefficients Z2 and/or Z3 as found. It is sufficient to determine only one of the two Zernike coefficients Z2, Z3 in cases for which the rest of the wavefront tilt information can be obtained from symmetry considerations.

In a refinement of the method according to the invention, the telecentricity determination is carried out on an optical imaging system of a microlithography projection exposure apparatus.

In another aspect, the invention relates to a microlithography projection exposure apparatus which has one or more optical imaging systems, for example an illumination system or a projection objective, and which is provided with an apparatus according to the invention for determining the telecentricity of the respective optical imaging system.

In an advantageous refinement of the invention, the microlithography projection exposure apparatus contains a control loop which can adjust one or more system components as a function of the result of a telecentricity determination.

BRIEF DESCRIPTION OF THE DRAWINGS

Preferred embodiments of the invention are represented in the drawings and will be described below. In the drawings.

Figure 1:
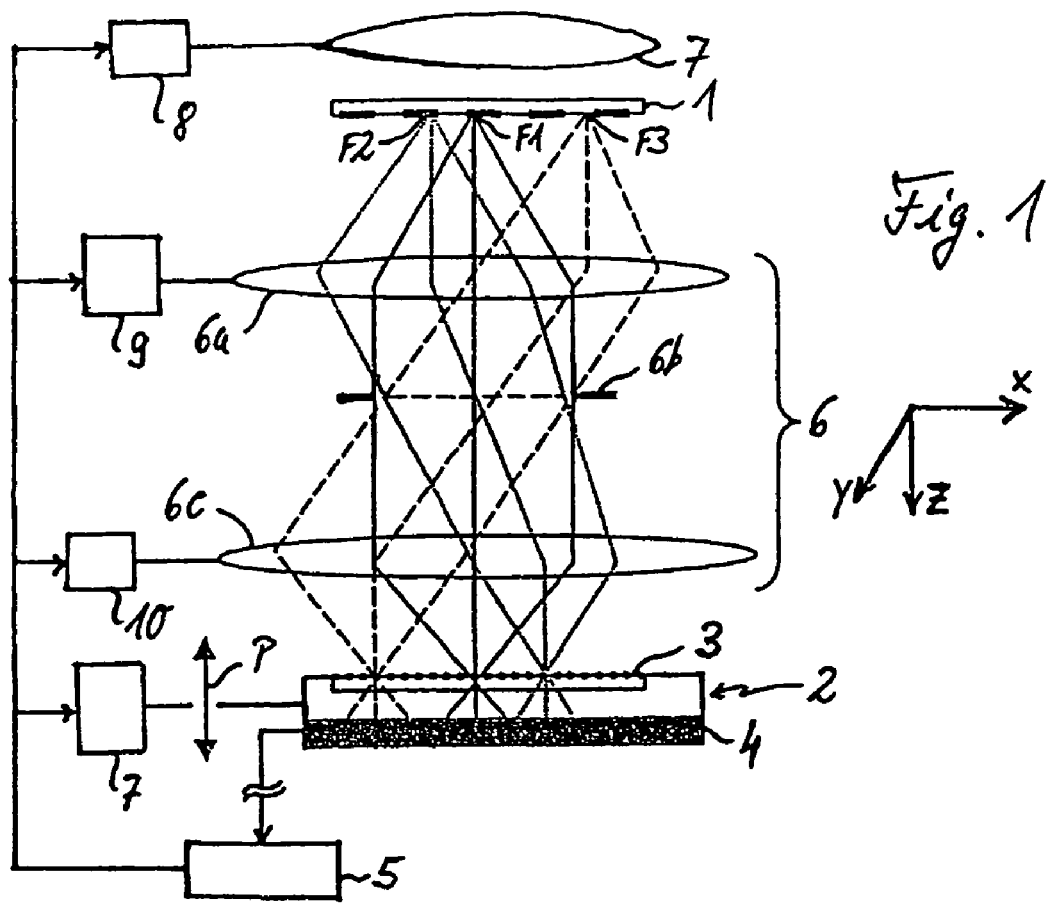
FIG. 1 shows a schematic side view of a microlithography projection exposure apparatus having an apparatus for determining the telecentricity of a projection objective.

The microlithography projection exposure apparatus shown in FIG. 1 contains an apparatus for determining telecentricity, which comprises an interferometric wavefront measuring device having a multichannel measurement reticle 1 and a measurement unit 2, in which a diffraction grating 3 and a downstream detector unit 4 are integrated to form a structural unit. Measurement information delivered by the detector unit 4 is sent to a computer unit 5 functioning as an evaluation unit, and evaluated by it.

FIG. 1 shows the apparatus in measurement operation to determine the telecentricity of a projection objective 6 of the microlithography projection exposure apparatus. The apparatus is in this case integrated into the projection exposure apparatus, although it may alternatively be constructed as a self-contained measurement station into which the projection objective is introduced for analysis before it is installed in the projection exposure apparatus. If need be, the apparatus for determining telecentricity may be combined with one or more other optical analysis apparatuses for analysis of the imaging system, or it may be configured so that in addition to determining the telecentricity, it also fulfils one or more other analysis functions, for example the determination of distortion, coma and Petzval correction errors.

The interferometric wavefront measuring device is designed with its aforementioned components to determine a wavefront tilt in one or two non-parallel transverse directions perpendicular to an optical axis of the imaging system 6, and specifically at a plurality of measurement points mutually offset in the direction of the optical axis. In relation to a cartesian xyz coordinate system indicated in FIG. 1, with the z direction pointing in the direction of the optical axis of the imaging system 6, this means determining the wavefront tilt in the xy plane, for example in the x direction and the y direction perpendicular thereto, for different z coordinates.

In the example of FIG. 1 the interferometric wavefront measuring device is embodied as a lateral shear interferometer, as is known per se for the wavefront analysis of lithography projection objectives and other optical imaging systems, and does not therefore require any further explanation here. In the case shown, the interferometric wavefront measuring device is of a parallel type, which can measure a plurality of field points simultaneously. To this end, the measurement reticle 1 is of a multichannel type and has a separate measurement structure for each field point being analyzed. As usual, the measurement reticle 1 is positioned on the object side of the imaging system 6, preferably in its object plane. During the measurement process, the measurement reticle 1 remains fixed in position and all the measurement channels, i.e. all the field point measurement structures, are simultaneously illuminated incoherently. In FIG. 1, the primary and the two peripheral rays are represented generically for three field points F1, F2, F3 respectively by solid, dotted and dashed lines. Alternatively, it is possible to use other conventional wavefront measuring devices, for example those which are based on point diffraction interferometry or some other interferometric technic, and those of a Shack-Hartmann type.

The measurement unit 2 is positioned on the image side of the imaging system 6, preferably so that the diffraction grating 3 lies in the vicinity of the image plane of the imaging system 6. The measurement unit 2 can be moved in the z direction into the various z measurement positions by an associated positioning unit 7. This corresponds to a staggered focus technique, according to which the measurement unit 2 is brought successively into various z measurement positions in and close to the theoretical focus position, in order to record a parameter to be measured in various z positions close to the actual focal position. The mobility of the measurement unit 2 in the z direction is indicated by a displacement arrow P in FIG. 1. The measurement unit 2 can also be moved laterally in the xy plane, as is usual for lateral shear interferometry measurement processes and does not therefore require any further explanation here.

As can be seen from the trajectory of the primary and peripheral rays, which are shown in FIG. 1 for the three generic field points F1, F2 and F3, the incoherently illuminated field points are projected onto the diffraction grating 3 through the objective 6 to be analyzed, of which only a lens 6a on the entry side with an associated adjustment manipulator 9, an aperture diaphragm 6b, and a lens 6c on the exit side with an associated adjustment manipulator 10 are shown generically. For the respective field point, the diffraction grating 3 then produces interfering radiation of various diffraction orders, the measurement unit 2 being designed so that only the zeroth diffraction order and the neighboring diffraction orders, i.e. the $+1^{st}$ and $-1^{st}$ diffraction orders, are relevant for the interferograms to be detected. The measurement reticle 1 is illuminated by an illumination system of the exposure apparatus, of which only an illumination lens 7 with an associated adjustment manipulator 8 is shown generically and schematically.

The detector unit 4, which may for example be a CCD camera, is placed with a detection surface, for example a CCD array, so close behind the diffraction grating 3 that the interferograms associated with the various field points do not perturb one another excessively, i.e. the interferences of the zeroth diffraction order with the $\pm 1^{st}$ diffraction orders can be recorded and evaluated separately with a sufficient accuracy for each field point. As is known, the periodicity length of the grating structure of the diffraction grating 3, which may for example be a one-dimensional periodic line grating structure or a two-dimensional periodic checkerboard grating structure, determines the so-called shear distance of the shear interferometry measurement.

In an alternative to the embodiment of the measurement unit 2 as shown, the detector unit 4 may be placed with its detection surface at a large distance behind the diffraction grating 3, in which case the measurement unit 2 will be equipped with further imaging optics which project the diffraction grating 3 onto the detection surface.

As is known for such lateral shear interferometers, the wavefront in a pupil plane of the imaging system 6 can be reconstructed for each field point from the measured interferences produced by phase shifts in two non-parallel shear directions, the pupil plane for the imaging system 6 in FIG. 1 being defined for example by the plane of its aperture diaphragm 6b. The various imaging errors which may occur in imaging systems can then be determined, for example in a description involving the Zernike coefficients, from the reconstructed wavefront profile in the pupil plane. Lateral shear interferometers which are used to determine the aberration of lithography projection objectives, while using as measurement radiation the same radiation as that which is employed by the projection objective during the normal exposure processes, and which is delivered by an upstream illumination system, are for this reason referred to as working interferometers and are described in the corresponding prior patent applications by the Applicant, to which reference may be made for further details. These relate both to the type without imaging optics on the detector side, as shown in FIG. 1, and to the type with imaging optics on the detector side.

Alternatively, the wavefront measuring device of the present invention may also belong to any other of the conventional types, so long as they make it possible to find the wavefront tilt imaging error associated with the Zernike coefficients Z2 and Z3 separately from any other imaging errors, as is the case with the exemplary design as a lateral shear interferometer according to FIG. 1. In the shear interferometry technique, the wavefront tilt can even be determined directly as an averaged constant of integration from the recorded wavefront derivatives.

Figure 2:
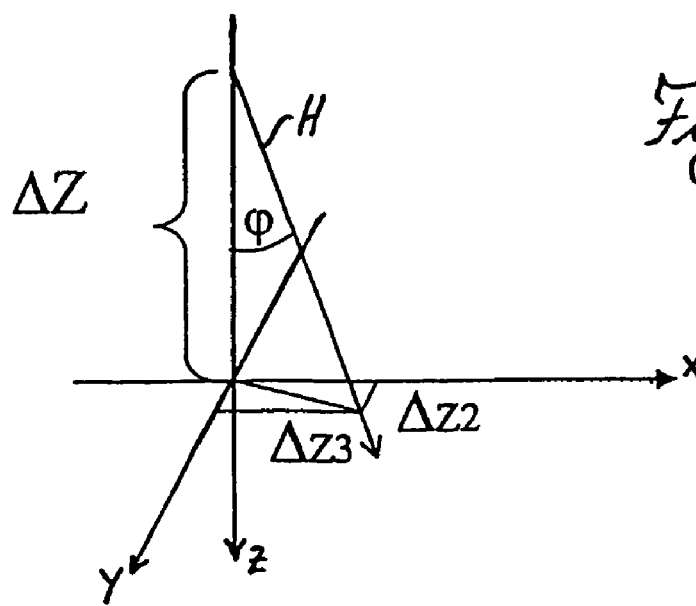
FIG. 2 shows a diagram to illustrate a telecentricity error which can be determined by the apparatus in FIG. 1.

The invention uses the capacity for separate determination of the Zernike coefficients Z2 and Z3 to determine the telecentricity. FIG. 2 illustrates the relevant geometrical situation. As is known, the telecentricity error is defined by an image-side tilt angle $\phi$ of a primary ray H which ideally travels parallel to the optical axis, i.e. the z direction. As is also known, the Zernike coefficients Z2 and Z3 indicate the wavefront tilt respectively in the x and y directions, which corresponds to a commensurate lateral offset of the energy centroid of the radiation. On the other hand, the dependency of the Zernike coefficients Z2 and Z3 from the z direction describes the trajectory of the primary ray H, which according to FIG. 2 gives the following trigonometric relationship for $\tan\phi$ as a measure of the telecentricity error $$\tan\phi = ((\Delta Z2)^2 + (\Delta Z3)^2)^{0.5}/(\Delta Z \cdot NA) = ((dZ2/dZ)^2 + (dZ3/dZ)^2)^{0.5} \cdot NA,$$

i.e. the telecentricity error can be determined with the aid of the gradients dZ2/dZ and d/Z3/dZ of the profile of the Zernike coefficients Z2 and Z3 in the z direction, where NA denotes the numerical aperture of the test object 6.

To this end, the profile of the Zernike coefficient Z2 as a function of the z coordinate and the profile of the Zernike coefficient Z3 as a function of the z coordinate are first determined by using the interferometric wavefront measuring device, for which the measurement unit 2 is successively moved into correspondingly different z positions and a lateral shear interferometry measurement, or another interferometric measurement process which is suitable for separately determining the Zernike coefficients Z2 and Z3, is then carried out respectively for each field point in question. For every z position which is adjusted, the evaluation unit 5 finds the values of the Zernike coefficients Z2 and Z3 by a corresponding Zernike analysis of the reconstructed wavefront profile in the pupil plane of the imaging system 6 being analyzed, or by another suitable conventional evaluation algorithm depending on the type of interferometric wavefront measuring device being used. In particular, the interferometric wavefront measuring device being used permits a wavefront measurement such that higher-order imaging errors, for example the Petzval correction errors given by the Zernike coefficient Z4 or the coma errors given by the Zernike coefficients Z7 and/or Z8, Z14 and/or Z15 etc., can be separated by the Zernike analysis from the linear wavefront tilt crucial for determining the telecentricity here, which is given by the Zernike coefficients Z2 and Z3. When using a suitable interferometric wavefront measuring device, such as the lateral multichannel shear interferometer as shown, it is consequently possible to find both the pure telecentricity error, i.e. the linear imaging error component characterized by the tilt angle $\phi$, and for example the real position of the energy centroid which can be calculated using all the recorded Zernike coefficients.

Figure 3:
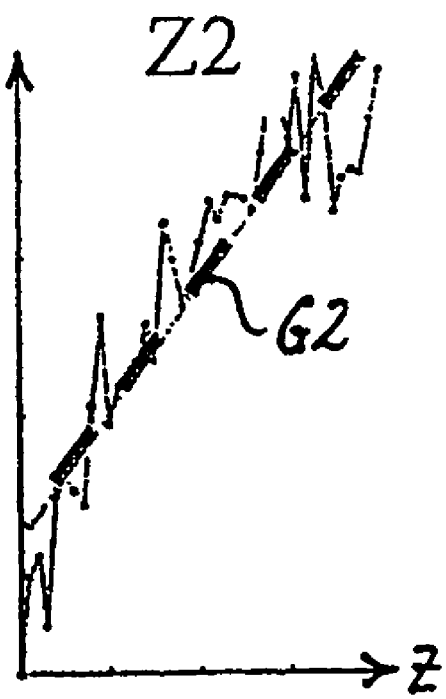
FIG. 3 shows a diagram of a profile of the Zernike coefficient Z2 in the z direction, as found by the apparatus of FIG. 1 for the optical imaging system of FIG. 1 being analyzed.
Figure 4:
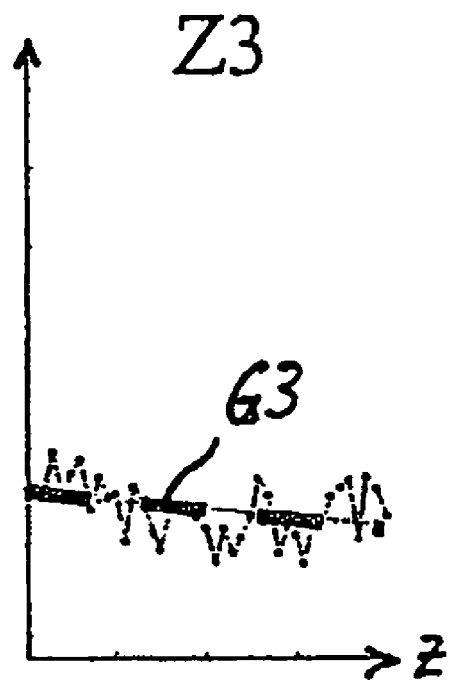
FIG. 4 shows a diagram corresponding to FIG. 3 for the Zernike coefficient Z3.

FIGS. 3 and 4 illustrate experimental results of a determination as explained above for the profile Zernike coefficients Z2 and Z3, respectively, as a function of the z coordinate. After having found the individual values of the Zernike coefficients Z2 and Z3 at the various z measuring positions, the evaluation unit 5 uses a conventional linear curve fitting algorithm to find a best fit straight line G2, G3 through the measurement values obtained for Z2 and Z3, respectively. The best fit straight line G2 or G3, respectively, obtained for the measurement values in FIGS. 3 and 4 is indicated by a thick dashed line. The slope dG2/dZ or dG3/dZ of the respectively determined best fit straight line G2, G3 is then employed as the gradient dZ2/dZ or dZ3/dZ of the profile of the associated Zernike coefficients Z2 and Z3, respectively, in the above relation for the telecentricity error, so that the evaluation unit 5 determines a telecentricity error value of interest from the wavefront tilt measurement values obtained by the interferometric wavefront measuring device.

In particular cases, for example with a radially symmetric telecentricity profile, it is sufficient merely to determine the wavefront tilt in only one direction, for example a radial direction, and thereby for example to determine only one of the two Zernike coefficients Z2, Z3. The full wavefront tilt is then obtained from symmetry considerations.

In the projection exposure apparatus of FIG. 1, the telecentricity error as found may also contain a contribution from the upstream illumination system 7 in addition to a contribution by the objective 6. If the telecentricity profile of the illumination system 7 is known in this case, it can be calculated out from the telecentricity profile found for the overall system, so as to determine the telecentricity profile of the objective 6. Conversely, if the telecentricity profile of the objective 6 is known, its contribution to the recorded telecentricity profile of the overall system can be separated off in order to find the telecentricity profile for the illumination system 7.

In an application for microlithography projection exposure apparatus of the type in FIG. 1, the invention thus allows adjustment of the projection objective 6 and/or of the upstream illumination system 7.

In an advantageous embodiment of the invention, the microlithography projection exposure apparatus as shown in FIG. 1 is equipped with a control loop which makes it possible to adjust optical system components as a function of the telecentricity profile as measured. This is suitable, in particular, for exposure apparatus of the scanner type. To this end, the computer unit 5 drives one or more of the adjustment manipulators 8, 9, 10 provided for one or more illumination system components and/or one or more objective components, as a function of the telecentricity error data as found, in order to adjust or realign the relevant system components suitably with a view to minimizing the telecentricity error.

As emerges clearly from the above description of preferred embodiments and procedures, by using an appropriate wavefront measuring device, the apparatus according to the invention and the method according to the invention make it possible to determine separately the wavefront tilt given by the Zernike coefficient or coefficients Z2, Z3 and from this to determine any telecentricity error for an optical imaging system being analyzed. By using an interferometric wavefront measuring device with a plurality of parallel measurement channels, the relevant wavefront tilts in a pupil plane of the imaging system can be measured as a function of the focal position, i.e. the z position, for the plurality of field points in parallel, i.e. simultaneously, so that the telecentricity profile can be determined directly. This type of telecentricity determination is relatively insensitive to the simultaneous presence of other imaging errors and to perturbing effects on the illumination side, such as nonuniform lighting or a telecentricity error of an upstream illumination system.

The invention can be used profitably in many applications. By comparing telecentricity data found according to the invention with data calculated during the design of the imaging system, for example, it is possible to check how far the real imaging system corresponds to the design specifications. In combination with a Zernike analysis of the aberrations, real telecentricity data demonstrate how the overlay, Petzval and other aberrations influence one another in a specific situation. If need be, this can be used in order to intelligently relax specifications of the imaging system being analyzed. The telecentricity error values measured according to the invention can also be used to improve an adjustment process for the imaging system, for example to adjust a microlithography projection objective, since the real telecentricity error values as found depend on the status of the objective and supplement information which can be obtained from the Zernike values. Especially in an application for microlithography projection exposure apparatus of the scanner type, the telecentricity error data found according to the invention can be used for more accurate positioning of a wafer stage and/or modification of adjustable optical components. The telecentricity error data as found may also be utilized in so-called scanner to scanner matching.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. An apparatus for determining the telecentricity of an optical imaging system, comprising:
   a wavefront measuring device which measures a wavefront tilt in one or more non-parallel transverse directions perpendicular to an optical axis of the optical imaging system, at a plurality of measurement points which are mutually offset in the direction of the optical axis, and
   an evaluation unit which determines a telecentricity error value from the measured wavefront tilt values.

2. The apparatus as claimed in claim 1, wherein the wavefront measuring device comprises:
   a measurement reticle arranged on an object side of the optical imaging system, comprising at least two measurement structures which are respectively allocated to a field point, and
   a measurement unit arranged on an image side of the optical imaging system, which records wavefront interferences for measuring the wavefront tilt, separately for the two measurement structures.

3. The apparatus as claimed in claim 1, wherein the wavefront measuring device comprises:
   a measurement reticle arranged on an object side of the optical imaging system, comprising at least one measurement structure for an associated field point, and
   a measurement unit arranged on an image side of the optical imaging system, which records wavefront interferences for measuring the wavefront tilt, for the at least one measurement structure, and which comprises a diffraction grating and a downstream detector unit.

4. The apparatus as claimed in claim 2, wherein the wavefront measuring device further comprises a positioning unit which positions the measurement unit displaceably in the direction of the optical axis.

5. The apparatus as claimed in claim 1, wherein the wavefront measuring device is of an interferometric type or of a Shack-Hartmann type.

6. The apparatus as claimed in claim 5, wherein the wavefront measuring device is a lateral shear interferometer.

7. The apparatus as claimed in claim 1, wherein the evaluation unit finds, from the measured wavefront tilt values, a linear profile the wavefront tilt as a function of the measurement position in the direction of the optical axis, and determines the telecentricity error value with the aid of the linear profile.

8. The apparatus as claimed in claim 1, wherein the apparatus determines the telecentricity of an optical imaging system for a microlithography projection exposure apparatus.

9. A method for determining the telecentricity of an optical imaging system, comprising:
  using a wavefront measuring device to measure a wavefront tilt in one or more non-parallel transverse directions perpendicular to an optical axis of the optical imaging system, at a plurality of measurement points which are mutually offset in the direction of the optical axis, and
  determining a telecentricity error value from the measured wavefront tilt values.

10. The method as claimed in claim 9, wherein
  in order to determine the wavefront tilt in two transverse directions, the wavefront measuring device produces wavefront interferences, and at least one of the Zernike coefficients Z2 and Z3 is found from the wavefront interferences, and
  the telecentricity error value is determined from a linear dependency on the measurement position in the direction of the optical axis of the optical imaging system, which is ascertained for at least one of the coefficients Z2 and Z3 as found.

11. The method as claimed in claim 9, wherein the telecentricity determination is carried out for one or more optical imaging systems of a microlithography projection exposure apparatus.

12. The method as claimed in claim 11, wherein the telecentricity determination is carried out for an illumination system of the microlithography projection exposure apparatus.

13. The method as claimed in claim 11, wherein the telecentricity determination is carried out for a projection objective of the microlithography projection exposure apparatus.

14. A microlithography projection exposure apparatus comprising a device for determining the telecentricity of an optical imaging system belonging to the exposure apparatus, the device comprising:
  a wavefront measuring device which measures a wavefront tilt in one or more non-parallel transverse directions perpendicular to an optical axis of the optical imaging system, at a plurality of measurement points which are mutually offset in the direction of the optical axis, and
  an evaluation unit which determines a telecentricity error value from the measured wavefront tilt values.

15. The microlithography projection exposure apparatus as claimed in claim 14, further comprising at least one optical component comprising an adjustment manipulator, wherein the adjustment manipulator is driven by the evaluation unit as a function of the telecentricity error value.

* * * * *